(12) United States Patent
Rahman et al.

(10) Patent No.: US 7,272,178 B2
(45) Date of Patent: Sep. 18, 2007

(54) METHOD AND APPARATUS FOR CONTROLLING THE BANDWIDTH FREQUENCY OF AN ANALOG FILTER

(75) Inventors: Mahibur Rahman, Lake Worth, FL (US); Homero Luz Guimaraes, Round Lake Beach, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 680 days.

(21) Appl. No.: 10/730,387

(22) Filed: Dec. 8, 2003

(65) Prior Publication Data

US 2005/0123036 A1  Jun. 9, 2005

(51) Int. Cl.
*H04B 1/66* (2006.01)
*H04B 1/00* (2006.01)

(52) U.S. Cl. .............. 375/240; 375/146; 375/147
(58) Field of Classification Search ........... 375/146, 375/147, 229, 285, 295, 240, 316, 317, 318, 375/319, 346
See application file for complete search history.

(56) References Cited

U.S. PATENT DOCUMENTS

| 5,612,975 | A  | * | 3/1997  | Becker et al. ........... 375/319 |
| 6,304,615 | B1 | * | 10/2001 | Webster ................... 375/319 |
| 6,498,929 | B1 | * | 12/2002 | Tsurumi et al. .......... 455/296 |
| 2003/0007574 | A1 | * | 1/2003 | Li et al. .................. 375/316 |
| 2003/0199264 | A1 | * | 10/2003 | Holenstein et al. ...... 455/324 |

OTHER PUBLICATIONS

Lindfors et al., "A 3-V Continuous-Time Filter with On-Chip Tuning for IS-95," IEEE Journal of Solid-State Circuits, vol. 34, No. 8, Aug. 1999, pp. 1150-1154.
Yamazaki et al., "WP23.1 A 450kHz CMOS Gm-C Bandpass Filter with +/−0.5% Center Frequency Accuracy for On-Chip PDC IF Receivers," 1999 IEEE International Solid-State Circuits Conference, ISSCC99/Session 23/Paper WP 23.1, pp. 392-393, p. 482.
Durham et al., "Circuit Architectures for High Linearity Monolithic Continuous-Time Filtering," IEEE Transactions on Circuits and Systems—II: Analog and Digital Signal Processing, vol. 39, No. 9, Sep. 1992, pp. 651-657.

* cited by examiner

*Primary Examiner*—David C. Payne
*Assistant Examiner*—Leon Flores
(74) *Attorney, Agent, or Firm*—Daniel D. Hill

(57) ABSTRACT

An analog filter (10) having a bandwidth tracking circuit includes an analog filter element (14) and a digital tracking loop (22). The digital tracking loop (22) compares a magnitude difference to a predetermined threshold to generate an error signal. The magnitude difference is determined during a closed loop bandwidth calibration by subtracting a first magnitude of an analog input signal over a predetermined frequency range to a second magnitude of the analog input signal over the predetermined frequency range located near the bandwidth frequency. Use of the digital tracking loop (22) provides a digital approach for achieving bandwidth tracking of an analog filter without the need for achieving any manufacturing process matching between the analog filter and the tracking circuit itself. The analog filter element (14) may be either a lowpass, highpass, bandpass, active or passive filter element.

26 Claims, 3 Drawing Sheets

METHOD AND APPARATUS FOR CONTROLLING THE BANDWIDTH FREQUENCY OF AN ANALOG FILTER

REFERENCE TO RELATED COPENDING APPLICATION

This application is related to U.S. patent application Ser. No. 10/096,460, entitled "SELF CALIBRATING TRANSMIT PATH CORRECTION SYSTEM" by Mahibur Rahman et al., filed Mar. 12, 2002, and assigned to the assignee hereof.

FIELD OF THE INVENTION

This invention relates to integrated circuits (ICs), and more particularly to a method and apparatus for controlling the bandwidth frequency of an analog filter.

BACKGROUND OF THE INVENTION

Analog filters are frequently used in wireless devices such as cellular telephones. However, bandwidth variations in an analog filter may lead to significant performance degradation in both the receive and transmit signal paths of the wireless device. In the receive path, variations in the bandwidth of the receiver's baseband analog filter leads to performance degradation in static sensitivity, sensitivity in the presence of interferers, receiver IP3, and anti-aliasing performance. For example, in the case of wideband code-division multiple access (WCDMA), the 0.1% bit error rate (BER) static sensitivity degradation due to +/−12% analog filter bandwidth variation is around 0.5 dB.

Alternately, in the transmit path, variations in the transmitter's baseband filter bandwidth leads to performance degradation in the transmitter's EVM (Error Vector Magnitude), ACLR (Adjacent Channel Leakage Ratio), and static/transient power mask performance. As an example, greater than 5% variation in the transmit baseband filter's bandwidth leads to significantly reduced margin to be able to meet strict EVM requirements for the EDGE protocol.

One prior art method for baseband analog filter tuning is based on the concept of master-slave tracking. Either a filter stage or a high-Q biquad stage is used as an oscillator with the exact same topology as the circuit used in the sections of the main filter. Any process and/or temperature variations should affect the main filter and the slave circuit by the same amount. Therefore, to insure that the process and temperature variations of the slave circuit matches those of the main filter, the slave circuit is positioned in close proximity to the main filter on the integrated circuit. The next step is to establish a closed control loop, which may be a phase-locked-loop (PLL) around the slave to keep the frequency oscillation of the biquad oscillator (or the phase difference if a slave of the filter is being used) always close to a stable value (i.e. an external crystal oscillator frequency or a predefined phase difference). In so doing, the frequency properties of the filter are stable with respect to process/temperature variations due to the matching between the master/slave circuits. The frequency of oscillation of the biquad or the cutoff frequency of the filter is controlled in the PLL by tuning all the resistors (or capacitors) of the master filter using a binary word resultant from the phase comparison between the stable reference frequency and the slave biquad oscillation.

However, in practice, matching the process and temperature variations between the main filter and the slave circuit is difficult because in some embodiments, the main filter may be very large and complex. Even if the slave circuit is placed directly adjacent to the main filter, it may still be relatively far away from some of the filter sections.

Therefore, there is a need for a more accurate method for controlling the bandwidth frequency of an analog filter.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings, in which like reference numbers indicate similar elements.

DETAILED DESCRIPTION OF THE PREFERRED EMBODIMENT

Generally, the present invention provides a higher performance, lower cost, and lower power digital approach to achieving bandwidth tracking of an analog filter without the need for achieving any matching between the analog filter and the tracking circuit itself. The analog filter bandwidth tracking loop includes an analog filter element (either active or passive), and a digital tracking loop. This analog filter may be a lowpass, bandpass, or highpass filter. The digital tracking loop compares a magnitude difference to a predetermined threshold to generate an error signal. The magnitude difference is determined during a closed loop bandwidth calibration process by subtracting a magnitude of an analog input signal over a predetermined frequency range near the center frequency of the analog filter to a magnitude of the analog input signal over a predetermined frequency range near the bandwidth frequency of the analog filter. The result of this subtraction is then compared to a fixed threshold level to produce a bandwidth error signal. This error signal is then filtered in a digital loop filter which controls the loop dynamics. The output of the loop filter generates an averaged error signal which is then fed into a lookup table which generates a control word. This control word directly controls the pole and zero locations of the analog filter stage.

An advantage of the present invention over the prior art is that the prior art relies on the matching between the various sections of the main analog filter and its slave analog tracking circuit. This matching cannot be guaranteed in practice because the main filter can be so complex that it occupies a large area forcing the slave circuit (tracking oscillator or filter) to be placed near the filter's periphery, far away from some of the filter sections. The digital tracking scheme of the present invention does not rely on any matching and thus can yield a very precise tuning. Also, digital tracking provides the benefit of better matching between I and Q channels of a receiver or transmitter. This approach can yield an improvement of 5-10% in the poles/zero precision of the analog filter over the prior art tracking technique that depends of matching between filter components. In addition, this method for bandwidth tracking can improve integrated circuit manufacturing yields because it is not necessary to insure precise matching of process variations during the semiconductor manufacturing process.

Figure 1:
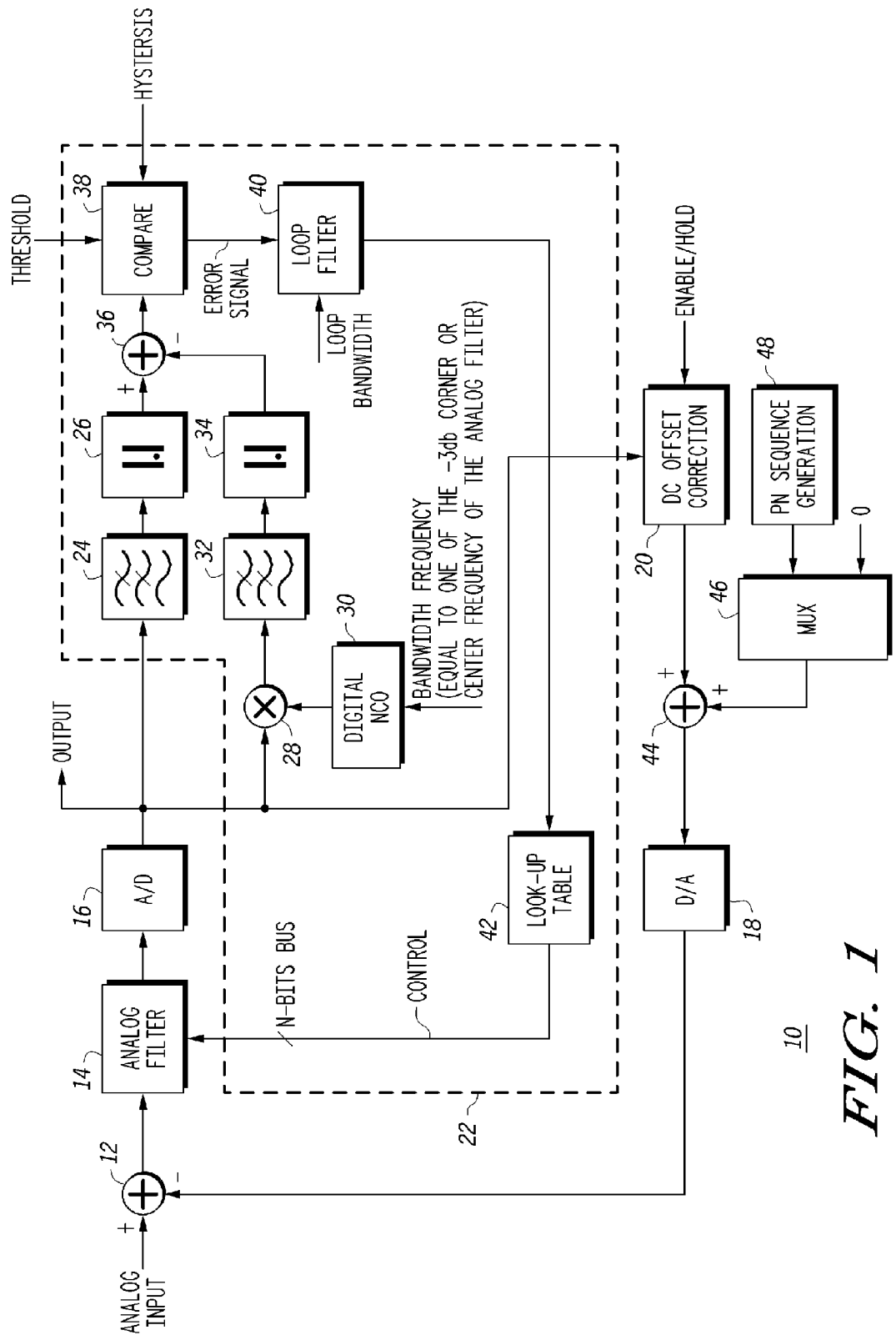
FIG. 1 illustrates a baseband analog filter for a receiver in accordance with the present invention.

FIG. 1 illustrates a baseband analog filter 10 having a bandwidth tracking circuit for a receiver in accordance with the present invention. Analog filter 10 includes summation elements 12 and 44, analog filter element 14, analog-to-digital (A/D) converter 16, digital-to-analog (D/A) converter 18, DC offset correction unit 20, a digital tracking loop 22, multiplexer 48 and PN (pseudo-random number) sequence generator 48. Digital tracking loop 22 includes low pass filters 24 and 32, magnitude determination units 26 and 34, summation element 36, mixer 28, digital numerically controlled oscillator (NCO) 30, comparator 38, loop filter 40, and look-up table 42. In accordance with one embodiment of the present invention, two identical filter circuits 10 are used in a quadrature receiver having separate I and Q channels. The receiver may be used in, for example, a spread spectrum code-division multiple access (CDMA) cellular telephone.

As illustrated in FIG. 1, summation element 12 has a first input for receiving an analog signal labeled "ANALOG INPUT", a second input, and an output. Analog filter element 14 has an input coupled to the output of summation element 12, a control input for receiving a multiple bit control signal, and an output. The multiple-bit control signal controls the bandwidth frequency of filter element 14 by moving the poles and zeros to the desired positions to achieve the desired filter bandwidth. In the illustrated embodiment, filter element 14 is an active RC filter. In other embodiments, filter element 14 may be a transconductance (gm-C) type filter. A/D converter 16 has an input coupled to the output of filter element 14, and an output for providing a digital representation of the output labeled "OUTPUT" of filter element 14. The output signal OUTPUT is provided as an input to digital tracking loop 22 and to DC offset correction unit 20. The output signal OUTPUT is also provided to other receiver circuitry (not shown). DC offset correction is used in filter circuit 10 during a warm-up period in response to an enable signal labeled "ENABLE/HOLD". An output of DC offset correction unit 20 is coupled to an input of summation element 44. PN sequence generation unit 48 is coupled to an input of summation element 44 via a multiplexer 46. This PN sequence generator is used as a training signal for the closed loop bandwidth tracking system during a receiver warmup process. An output of summation element 44 is coupled to an input of D/A converter 18. An output of D/A converter 18 provides an analog signal to a minus input of summation element 12. Summation element 12 subtracts the output of D/A converter 18 from the analog input signal INPUT and provides the difference to the input of analog filter 14.

In digital tracking loop 22, the output signal OUTPUT is first provided to inputs of low pass filter 24 and to mixer 28. Mixer 28 receives a sinusoidal signal located at the analog filter's bandwidth frequency from digital NCO 30 and is used to shift the spectrum of the OUTPUT signal by the indicated frequency amount. Note that the bandwidth frequency may be the −3 dB frequency location or it may be some other chosen frequency location near this frequency location. Low pass filter 32 is coupled to the output of mixer 28. Low pass filters 24 and 32 both have the same bandwidth. Magnitude determination unit 26 is coupled to low pass filter 24 and magnitude determination unit 34 is coupled to low pass filter 32. Summation element 36 provides a magnitude difference of the outputs of magnitude determination units 26 and 34. The output of summation element 36 is then provided to an input of comparator 38. Comparator 38 compares the magnitude difference to a threshold value, and provides an error signal as an output. A hystersis value is also provided to comparator 38 to stabilize the output of comparator 38. Loop filter 40 receives the error signal from comparator 38 and provides an averaged error signal. The bandwidth of loop filter 40 is adjusted via a signal labeled "LOOP BANDWIDTH" which controls the loop dynamics. The averaged error signal is provided to look-up table 42. Look-up table 42 includes values for adjusting the poles and zeros of analog filter element 14. The operation of filter circuit 10 will be discussed in more detail below.

Figure 2:
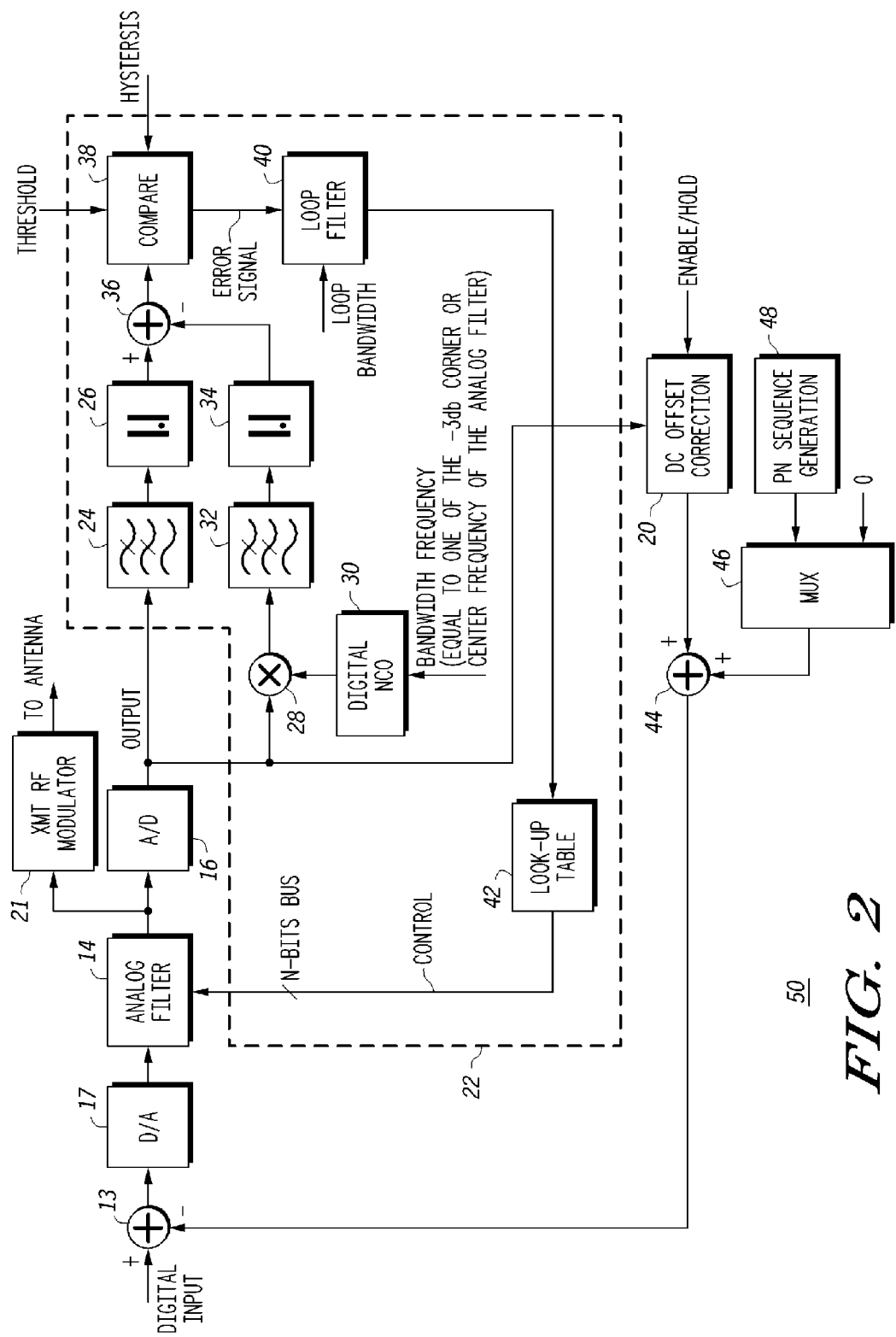
FIG. 2 illustrates a baseband analog filter for a transmitter in accordance with the present invention.

FIG. 2 illustrates a baseband analog filter 50 having a bandwidth tracking loop for a transmitter in accordance with the present invention. Note that for ease of describing the present invention, like or similar elements in FIG. 1 and FIG. 2 have the same reference numbers. In FIG. 2, a summation element 13 receives a digital input signal labeled "DIGITAL INPUT" at a plus (+) input terminal, a second digital input from an output of summation element 44, and provides a difference output to an input of D/A converter 17. An analog equivalent of the difference signal from summation element 13 is provided to an input of analog filter element 14. The output of this analog filter feeds into either the I or Q input to a Cartesian I-Q transmitter modulator. The output of the transmitter modulator has an output path to the power amplifier and then the antenna. A filtered output signal from filter element 14 is provided to A/D converter 16. A/D converter 16 converts the analog signal to a digital equivalent signal labeled "OUTPUT". The output signal OUTPUT is provided to an input of digital tracking loop 22.

In operation, digital tracking loop 22 provides bandwidth tracking of the analog filter circuit 10 for the receiver path of a wireless device. Similarly, as illustrated in FIG. 2, digital tracking loop 22 can provide the same functionality for an analog filter stage in the transmit path. The operation of digital tracking loop 22 is the same for both filter circuit 10 and filter circuit 50.

In FIG. 1, summation element 12, analog filter element 14, A/D converter 16, D/A converter 18, and DC offset correction unit 22 are elements that already exist in a typical receiver to perform baseband DC offset correction as described in U.S. Pat. No. 6,560,447. Likewise, in FIG. 2, summation element 13, D/A converter 17, filter element 14, A/D converter 16, DC offset correction unit 20, and RF modulator 21 already exist in a typical transmitter. Digital tracking loop 22 tracks and maintains the −3 dB corner of the active receive/transmit filter stage digitally with low cost and with relatively low power consumption.

Baseband DC offset correction of analog filter element 14 is achieved by sampling the output signal OUTPUT of analog filter 14 using A/D converter 16 and then applying a DC offset correction using DC offset correction unit 20 at summation element 12. DC offset correction is necessary in this type of filter circuit for zero IF (intermediate frequency) receivers and direct launch transmitters to achieve the desired receiver sensitivity and transmitter carrier suppression performance, respectively.

After baseband DC offset correction is completed and the DC correction value is held, PN (pseudo-random) sequence generator 48 is added to the DC correction value via summation element 44. Note that in another embodiment, a different type of calibration/training signal could also be used (e.g., a training signal with two sinusoidal tones). The output of summation element 44 is then applied as a wide band training signal at the input to analog filter element 14. The wide band training signal is low pass filtered by the analog filter element 14 and converted to digital form using A/D converter 16. In the illustrated embodiment, the sampling rate of A/D converter 16 is higher than twice the bandwidth of analog filter element 14 to avoid aliasing effects.

Closed loop bandwidth calibration using digital tracking loop 22 then begins. Digital tracking loop 22 first measures the difference in magnitude of the received training signal over a low frequency range versus that over the same range but centered at the ideal −3 dB corner required for the analog filter. Digital low pass filter 24 and magnitude determination unit 26 are used to provide a low pass filtered magnitude of the received training signal. Mixer 28, low pass filter 32, and magnitude determination unit 34 are used to determine a magnitude of the received training signal centered at the desired bandwidth frequency. Summation element 36 then provides a difference in the magnitudes. The difference in these two magnitudes is then compared to a programmed fixed threshold level using comparator 38. The output of comparator 38 represents a soft metric of the analog filter bandwidth error for filter element 14. Next, the resulting soft metric error is averaged using a first order digital loop filter 40 with programmable loop bandwidth to control the loop dynamics. Comparator 38 includes hysteresis to minimize chatter and hence provide a more stable error signal to the loop filter. Finally, the averaged error is used to choose a value from look-up table 42. The value from look-up table 42 is provided on a multiple bit bus to bias the selection of a control word used to control the pole-zero locations of analog filter element 14 to achieve the desired −3 dB filter corner. In the illustrated embodiment, the binary control words of look-up table 42 are used to adjust the resistors (or capacitors depending on the choice of filter implementation topology) such that the poles and zeros are moved to the desired positions to achieve the desired filter bandwidth. In another embodiment, the control words can be applied to a Gm-C type analog filter. In the case of a GM-C analog filter, a current-mode DAC may be needed to adjust the transconductances of the transconductors to modify the pole-zero locations.

Digital tracking loop 22 can run in a closed loop fashion in the embodiments of FIG. 1 and FIG. 2 over a fixed period to achieve the desired bandwidth tracking prior to a receive or transmit data transmission. In addition, in the case of spread spectrum CDMA systems, as long as the PN training signal used by the tracking loop uses a PN code that is orthogonal to the spreading codes used in a downlink, digital tracking loop 22 can also be enabled during actual data reception.

Figure 3:
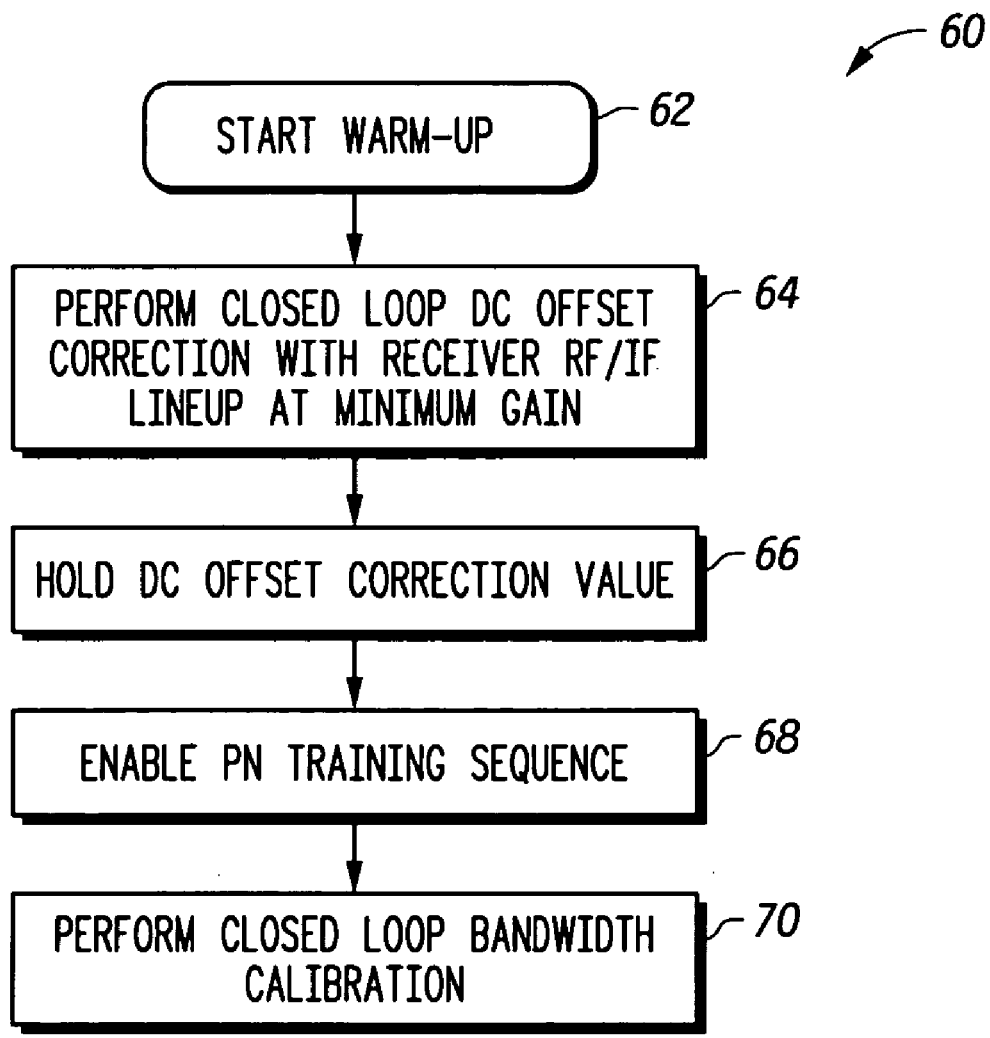
FIG. 3 illustrates a method for bandwidth tracking of the analog filters of FIG. 1 and FIG. 2.

FIG. 3 illustrates a method 66 for bandwidth tracking of the analog filter of FIG. 1. At step 62, a warm-up sequence of the system is begun. As illustrated at step 64, a closed loop DC offset correction is performed first. In the case of a receiver, the RF/IF lineup is placed at a minimum gain to ensure that a strong signal at the antenna does not degrade the performance of the DC offset correction and analog filter bandwidth tracking systems. Note that the method of FIG. 3 may be performed in the transmitter of FIG. 2 with the exception that it is not necessary to place the RF/IF lineup at minimum gain when performing the closed loop DC offset correction. At step 66, the DC offset correction value is held by asserting the HOLD signal at DC offset correction unit 22. At step 68, the PN training sequence is enabled by selecting the PN sequence generation input of multiplexer 46. A training signal is summed with the DC offset correction value by summation element 44. At step 70, a closed loop bandwidth calibration is performed using digital tracking loop 22. If the receiver is a spread spectrum CDMA receiver, then continue to run orthogonal PN training signals during data reception. Otherwise, hold the bandwidth tracking loop after the completion of step 4.

The present invention provides a low cost, low power, high performance digital method for controlling the bandwidth of an analog filter that does not require expensive process matching as required by the prior art.

In another embodiment, the present invention may be applied to bandpass or highpass filters in addition to low pass filters by placing another mixer between A/D converter (16) and the digital lowpass filter (24). The mixer would receive an NCO input signal defining the "center frequency" of the analog filter. The magnitude difference is computed by subtracting a magnitude of an analog input signal over a predetermined frequency range near the analog filter's center frequency to a magnitude of the analog input signal over a predetermined frequency range near the analog filter's bandwidth frequency.

Various changes and modifications to the embodiments herein chosen for purposes of illustration will readily occur to those skilled in the art. To the extent that such modifications and variations do not depart from the scope of the invention, they are intended to be included within the scope thereof, which is assessed only by a fair interpretation of the following claims.

What is claimed is:

1. A method for controlling a bandwidth of an analog filter circuit comprising:

performing a DC offset correction operation in the analog filter circuit to generate a DC offset correction signal;

holding the DC offset correction signal in the analog filter circuit;

adding a training signal to the DC offset correction signal;

determining a magnitude of a filtered input signal using the training signal and the DC offset correction signal;

determining a magnitude of the filtered input signal at a predetermined frequency using the training signal and the DC offset correction signal;

determining a difference between the magnitudes of the filtered input signal and the filtered input signal at the predetermined frequency;

comparing the difference to a predetermined threshold value to generate an error metric; and using the error metric to adjust the bandwidth frequency of the analog filter circuit.

2. The method of claim 1, wherein determining a magnitude of a filtered input signal further comprises:

low pass filtering the filtered input signal to generate a low pass filtered signal; and determining a magnitude of the low pass filtered signal.

3. The method of claim 1, wherein determining a magnitude of a filtered input signal at the predetermined frequency further comprises:

mixing the filtered input signal with a sinusoidal signal at the predetermined frequency to produce a baseband signal;

low pass filtering the baseband signal around the predetermined frequency to produce a low pass filtered input signal located at the predetermined frequency; and determining a magnitude of the low pass filtered input signal at the predetermined frequency.

4. The method of claim 1, wherein the predetermined frequency is a bandwidth frequency equal to about the −3 dB (decibel) corner of the analog filter.

5. The method of claim 1, further comprising filtering the error signal using a loop filter having a predetermined bandwidth.

6. The method of claim 1, wherein the error metric is used to select filter coefficients from a look-up table, the filter coefficients being used to adjust the bandwidth of the analog filter circuit.

7. The method of claim 1, wherein the error metric is used to select filter coefficients from a look-up table, the filter coefficients being used to adjust pole and zero locations of the analog filter circuit.

8. The method of claim 1, wherein the error metric is used to select filter coefficients from a look-up table, the filter coefficients being provided to the analog filter circuit on a multi-bit bus.

9. The method of claim 1, wherein the training value is generated using a pseudo-random sequence generator.

10. The method of claim 1, wherein the analog filter circuit is an active resistor-capacitor (RC) filter.

11. The method of claim 1, wherein the analog filter circuit is a gm-C type filter.

12. The method of claim 1, wherein the method is performed in a spread spectrum code-division multiple access (CDMA) receiver.

13. The method of claim 1, wherein the method is performed in a spread spectrum code-division multiple access (CDMA) transmitter.

14. A filter circuit comprising:
an analog filter element having an input for receiving an analog input signal, an output for providing a filtered output signal, and a control input for receiving a control signal for adjusting a bandwidth frequency of the analog filter element to a predetermined bandwidth frequency;
an analog-to-digital converter having an input coupled to the output of the analog filter element, and an output;
a digital tracking loop having an input coupled to the output of the analog-to-digital converter, and an output coupled to the control input of the analog filter element, the digital tracking loop for comparing a magnitude difference to a predetermined threshold to generate an error signal, the error signal used to generate the control signal, where the magnitude difference is determined by subtracting a first magnitude of the analog input signal over a predetermined frequency range to a second magnitude of the analog input signal over the predetermined frequency range.

15. The filter circuit of claim 14, wherein the analog filter element is characterized as being an active-RC (resistor-capacitor) filter element.

16. The filter circuit of claim 14, wherein the digital tracking loop further comprises:
a first low pass filter having an input coupled to the output of the analog-to-digital converter, and an output;
a first magnitude determination unit having an input coupled to the output of the low pass filter, and an output for providing the first magnitude of the analog input signal;
a mixer circuit having an input coupled to the output of the analog-to-digital converter, and an output;
a second low pass filter having an input coupled to the output of the mixer circuit, and an output;
a second magnitude determination unit having an input coupled to the output of the second low pass filter, and an output for providing the second magnitude of the analog input signal over the predetermined frequency range located approximately at the predetermined bandwidth frequency;
a summation element having an input for receiving the first and second magnitudes, and an output for providing the magnitude difference; and
a comparator having a first input for receiving the magnitude difference, a second input for receiving the predetermined threshold, and an output for providing the error signal.

17. The filter circuit of claim 16, further comprising:
a loop filter with programmable loop bandwidth having an input coupled to the output of the comparator, and an output; and
a look-up table having an input coupled to the loop filter, and an output for providing the control signal to the control input of the analog filter element.

18. The filter circuit of claim 16, further comprising a numerically controlled oscillator for providing a sinusoidal signal located approximately at the bandwidth frequency of the analog filter to the mixer circuit.

19. The filter circuit of claim 16, wherein the look-up table includes values for controlling pole and zero locations of the analog filter element.

20. The filter circuit of claim 14, further comprising:
a DC offset correction circuit having an input coupled to the output of the analog-to-digital converter, and an output;
a first summation circuit having a first input coupled to the output of the DC offset correction circuit, a second input, and an output;
a digital-to-analog converter having an input coupled to the output of the summation circuit, and an output; and
a second summation circuit having a first input coupled to the output of the digital-to-analog converter, a second input for receiving an analog signal, and an output coupled to the input of the analog filter element.

21. The filter circuit of claim 20, further comprising:
a random number sequence generator having an output coupled to the second input of the first summation circuit.

22. The filter circuit of claim 21, wherein the random number sequence generator is for generating a pseudo-random number sequence.

23. The filter circuit of claim 20, further comprising single or multiple sinusoidal tones generator having an input coupled to the second input of the first summation circuit.

24. The filter circuit of claim 14, wherein the filter circuit is used in a spread spectrum code-division multiple access (CDMA) receiver.

25. The filter circuit of claim 14, wherein the filter circuit is used in a spread spectrum code-division multiple access (CDMA) transmitter.

26. A filter circuit comprising:
an analog filter element having an input for receiving an analog input signal, an output for providing a filtered output signal, and a control input for receiving a control signal for adjusting a bandwidth frequency of the analog filter element to a predetermined bandwidth frequency;
an analog-to-digital converter having an input coupled to the output of the analog filter element, and an output;
a digital tracking loop having an input coupled to the output of the analog-to-digital converter, and an output coupled to the control input of the analog filter element, the digital tracking loop for comparing a magnitude difference to a predetermined threshold to generate an error signal, the error signal used to generate the control signal, where the magnitude difference is computed by subtracting a magnitude of an analog input signal over a predetermined frequency range approximately at the analog filter's center frequency from a magnitude of the analog input signal over the predetermined frequency range approximately at the bandwidth frequency of the analog filter.

* * * * *